US011217325B1

(12) United States Patent
Jhang et al.

(10) Patent No.: US 11,217,325 B1
(45) Date of Patent: Jan. 4, 2022

(54) APPARATUSES AND METHODS FOR PROVIDING INTERNAL DOUBLE DATA RATE OPERATION FROM EXTERNAL SINGLE DATA RATE SIGNALS

(71) Applicant: MICRON TECHNOLOGY, INC., Boise, ID (US)

(72) Inventors: Yuan Hsuan Jhang, Tokyo (JP); Toru Ishikawa, Kanagawa (JP); Takuya Nakanishi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/003,026

(22) Filed: Aug. 26, 2020

(51) Int. Cl.
*G11C 29/38* (2006.01)
*G11C 29/14* (2006.01)
*G11C 29/12* (2006.01)
*G11C 11/4076* (2006.01)

(52) U.S. Cl.
CPC .......... *G11C 29/38* (2013.01); *G11C 11/4076* (2013.01); *G11C 29/12015* (2013.01); *G11C 29/14* (2013.01)

(58) Field of Classification Search
CPC ................ G11C 29/38; G11C 11/4076; G11C 29/12015; G11C 29/14
See application file for complete search history.

(56) References Cited

U.S. PATENT DOCUMENTS

| | | | | |
|---|---|---|---|---|
| 8,059,484 B2* | 11/2011 | Yoko | ......................... | G11C 8/18 |
| | | | | 365/233.1 |
| 8,873,331 B2* | 10/2014 | Cho | ......................... | G11C 7/22 |
| | | | | 365/230.06 |
| 9,318,177 B2* | 4/2016 | Ko | ........................... | G11C 8/18 |
| 9,601,172 B2* | 3/2017 | Lee | ......................... | G11C 8/18 |
| 9,779,837 B1* | 10/2017 | Kwak | ................... | G11C 29/06 |
| 9,959,918 B2* | 5/2018 | Kim | ...................... | G11C 29/028 |
| 10,853,254 B2* | 12/2020 | Park | .................... | G06F 12/0215 |
| 10,902,894 B2* | 1/2021 | Kim | ..................... | G11C 7/1087 |
| 10,943,637 B2* | 3/2021 | Okuma | ................. | G11C 11/406 |

* cited by examiner

*Primary Examiner* — Tri M Hoang
(74) *Attorney, Agent, or Firm* — Dorsey & Whitney LLP

(57) ABSTRACT

In some examples, a memory device may include an internal synchronization circuit that provides for double data rate operation of the memory device when external single data rate signals are provided to the memory device. The external signals may be command and/or address signals provided by an external testing circuits in some examples. The internal synchronization circuit may latch and/or delay at least some of the external signals such that different external commands are provided at the rising and falling edges of the clock signal of the memory device. The memory device may latch the external signals at both the rising and falling edges of the clock signal for double data rate operation of the memory device.

20 Claims, 5 Drawing Sheets

APPARATUSES AND METHODS FOR PROVIDING INTERNAL DOUBLE DATA RATE OPERATION FROM EXTERNAL SINGLE DATA RATE SIGNALS

BACKGROUND

This disclosure relates generally to semiconductor devices, and more specifically to semiconductor memory devices. In particular, the disclosure relates to volatile memory, such as dynamic random access memory (DRAM). Memory operations, such as read and write operations, are performed based on timing signals provided by a clock circuit. The timing signal, also referred to as a clock signal, may be a periodic signal that oscillates between two clock levels (e.g., high and low clock levels). Different types of DRAM are designed to operate in various modes with respect to the clock signal. For example, single data rate (SDR) DRAM may perform various operations only on a rising (e.g., transitioning from the low clock level to the high clock level) or falling (e.g., transitioning from the high clock level to the low clock level) edge of the clock signal. For example, the SDR DRAM may detects (e.g., latches) commands, addresses, data, and/or other signals only on rising or falling edges of the clock signal. In contrast, double data rate (DDR) DRAM may perform various operations, such as detecting commands, addresses, data, and/or other signals, on both the rising and falling edges of the clock signal. In some applications DDR DRAM may operate at a faster rate than SDR DRAM even if both DRAM receive clock signals having a same frequency because at least some DDR DRAM operations may occur at a rate (e.g., DDR) of twice per clock cycle rather than at a rate (e.g., SDR) of once per clock cycle. DDR. Thus, DDR DRAM may provide higher throughput and/or faster performance of memory operations than SDR DRAM in some applications.

Typically, memory manufacturers test DRAM die to confirm the DRAM operates according to specifications prior to packaging and/or shipping to customers. It may be desirable to test the DRAM with testing conditions that are as similar to the operating conditions in which the DRAM will be used to help ensure the DRAM will function properly when used by the customer.

DETAILED DESCRIPTION

Figure 1:
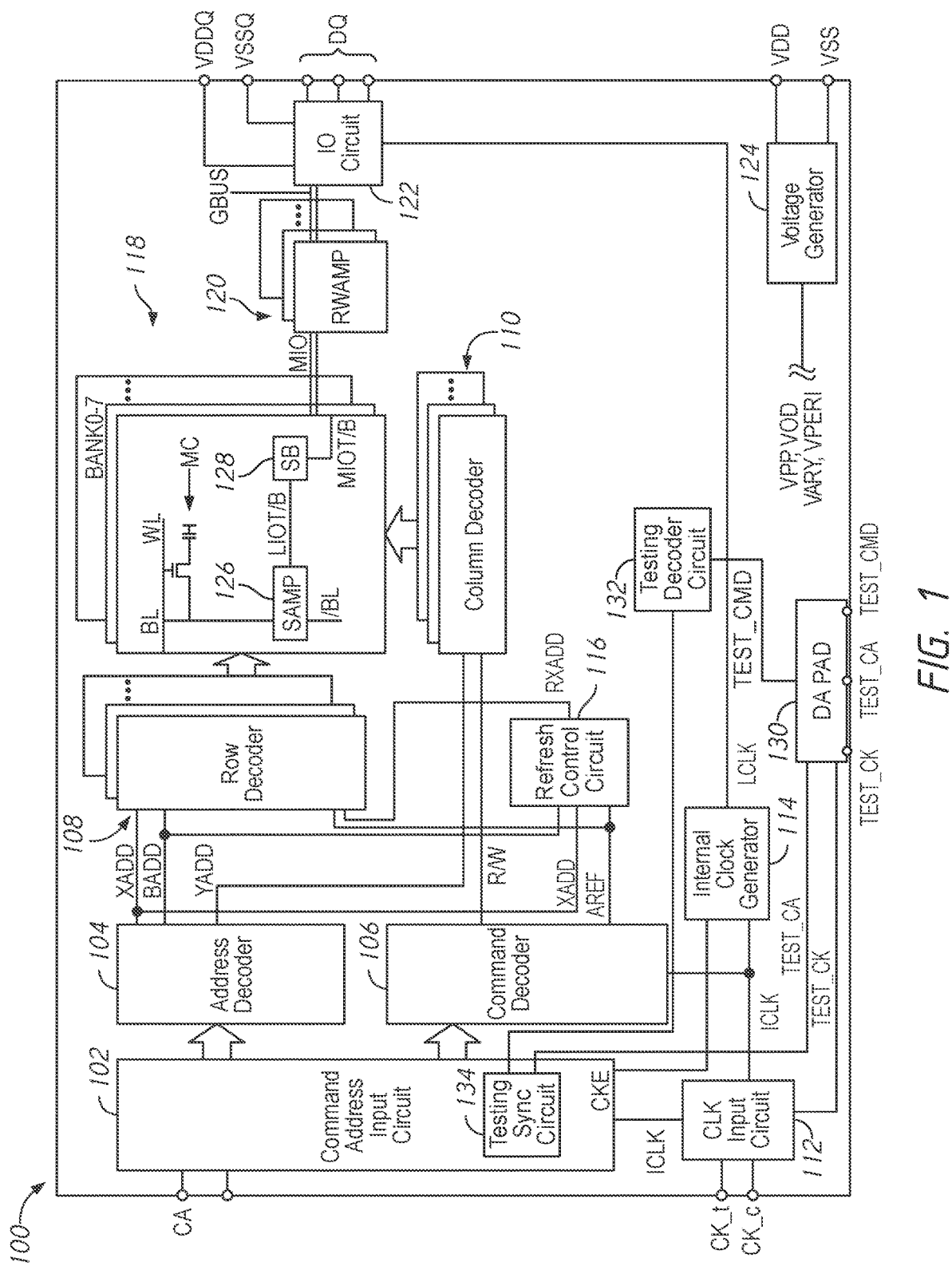
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present apparatuses, systems and methods, reference is made to the accompanying drawings which form a part hereof, and which are shown by way of illustration specific embodiments in which the described apparatuses, systems and methods may be practiced. These embodiments are described in sufficient detail to enable those skilled in the art to practice presently disclosed apparatuses, systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

As memory devices, such as DRAM, have become miniaturized, the memory devices have become easier to damage. This has made it more difficult to test memory prior to packaging. A die for a memory device typically includes various pads for providing signals to and receiving signals from an external device, such as a memory controller. For example, pads for providing and receiving data (e.g., DQ pads), pads for receiving command and address information (e.g., CA pads), and/or pads for receiving a clock signal may be included on the die. These pads may be coupled to the external device when the memory is packaged in a device (e.g., as part of a memory module). It may be desirable to test the memory prior to packaging to avoid having to discard the entire device if only the memory is defective. However, testing may damage the pads such that the memory cannot be coupled to the external device when packaging.

To solve this issue, some memory manufacturers provide a second set of pads on the die including the memory device to use for testing the memory device. The second set of pads may be located at a different location on the die to reduce the risk of accidentally touching, and thus damaging, the pads used for coupling the memory device to the external device. The second set of pads may be referred to collectively as an external direct access (DA) pad, although the external DA pad may be included on the same die as the memory device.

A testing device may provide clock signals, commands, addresses, and/or data to the memory device through the DA pad. The testing device may further receive data and/or other signals from the memory die from the DA pad. The testing device may analyze the received data and/or signals to determine whether the memory is operating properly.

Typically, memory manufacturers use testing devices that test several memory die in parallel (e.g., at or near the same time) to increase throughput. However, due, at least in part, to the large number of memory die that are tested in parallel, the testing device may not be able to provide command and/or address signals at a high rate of speed. In some applications, the testing device may only provide certain signals at SDR operation (e.g., providing a command at rising edges of a clock signal). This may prevent testing of some or all of the DDR operations (e.g., latching and executing commands received at rising edges and falling edges of a clock signal) of the memory die during some testing modes. Thus, not all of the operations of the memory die may be confirmed to working properly prior to packaging, which may be undesirable.

In some embodiments of the present disclosure, a memory device may include an internal synchronization circuit that changes the timing of SDR signals (e.g., signals provided at a speed for SDR operation) received from the DA pad to simulate DDR signals (e.g., signals provided at a speed for DDR operations). In some embodiments, the internal synchronization circuit may latch and delay certain signals received from the DA pad such that the signals are shifted (e.g., delayed) respective to an internal clock signal of the memory device. The shift in the signals may allow the signals to be latched by the memory device on both the rising edge and falling edge of the clock signal of the memory device. This may permit testing of DDR operations of the memory device in some applications.

FIG. 1 is a block diagram of a semiconductor device according an embodiment of the disclosure. The semiconductor device 100 may be a semiconductor memory device, such as a DRAM device integrated on a single semiconductor chip. In some embodiments, device 100 may be DDR DRAM.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. Each memory bank includes a plurality of word lines WL, a plurality of bit lines BL and /BL, and a plurality of memory cells MC arranged at intersections of the plurality of word lines WL and the plurality of bit lines BL and /BL. The selection of the word line WL is performed by a row decoder 108 and the selection of the bit lines BL, /BL is performed by a column decoder 110. In the embodiment of FIG. 1, the row decoder 108 includes a respective row decoder for each memory bank and the column decoder 110 includes a respective column decoder for each memory bank. The bit lines BL, /BL are coupled to a respective sense amplifier (SAMP) 126. Read data from bit lines BL, /BL is amplified by the sense amplifier 126 and the signal is provided to a sub-amplifier (SB) 128 over local data lines (LIOT/B). The sub-amplifier 128 may provide a signal to main data lines (MIOT/B). The main data lines may provide the signal to a read/write amplifier (RWAMP) 120. The read/write amplifier 120 may provide the read data to an input/output (IO) circuit 122 over a global data bus (GBUS). Conversely, write data received from the IO circuit 122 via the global data bus is provided from the read/write amplifiers 120 over the main data lines MIO, the sub-amplifier 128, and the local data lines LIOT/B to the sense amplifier 126, and written in the memory cell MC coupled to the bit line BL, /BL.

The semiconductor device 100 may employ a plurality of external terminals that include command and address (CA) terminals coupled to a command and address bus to receive commands and addresses, and a chip select signal, clock terminals to receive clocks CK_t and CK_c, data terminals DQ to provide data, and power supply terminals to receive power supply potentials VDD, VSS, VDDQ, and VSSQ.

The clock terminals are supplied with external clocks CK_t and CK_c that are provided to an input circuit 112. The external clocks may be complementary. The input circuit 112 generates an internal clock ICLK based on the CK_t and CK_c clocks. The ICLK clock is provided to the command/address input circuit 102, command decoder 106 and to an internal clock generator 114. The internal clock generator 114 provides various internal data clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The CA terminals may be supplied with memory addresses. The memory addresses supplied to the CA terminals are transferred, via a command/address input circuit 102, to an address decoder 104. The address decoder 104 receives the address and supplies a decoded row address XADD to the row decoder 108 and supplies a decoded column address YADD to the column decoder 110. The address decoder 104 may also supply a decoded bank address BADD, which may indicate the bank of the memory array 118 containing the decoded row address XADD and column address YADD. The CA terminals may be supplied with commands. Examples of commands include access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed. The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal to select a word line and a column command signal to select a bit line.

The command/address input circuit 102 may include one or more latches (not shown in FIG. 1) for storing, at least temporarily, the commands and/or addresses received from the CA terminals. In some embodiments, the command/address input circuit 102 may include one or more latches to latch commands and/or addresses on rising edges of ICLK and one or more latches to latch commands and/or addresses on falling edges of ICLK. Including latches for latching on rising clock edges and latches for latching on falling clock edges may allow the device 100 to operate in a DDR manner. In some embodiments, latches included in the command/address input circuit 102 may latch commands and/or addresses on rising clock edges. However, some latches may be provided with clock signal ICLK while other latches are provided with a complementary clock signal /ICLK. Thus, commands and/or addresses may be latched by the command/address input circuit 102 at times corresponding to both the rising and falling edges of ICLK.

The device 100 may receive an access command which is a read command. When an activate and read command are received, and a bank address, a row address and a column address are timely supplied with the activate and read commands, read data is read from memory cells in the memory array 118 corresponding to the row address and column address. The activate and read commands are received by the command decoder 106, which provides internal commands so that read data from the memory array 118 is provided to the read/write amplifiers 120. The read data is output to outside from the data terminals DQ via the IO circuit 122.

The device 100 may receive an access command which is a write command. When an activate and a write command are received, and a bank address, a row address and a column address are timely supplied with the activate and write commands, write data supplied to the data terminals DQ is written to a memory cells in the memory array 118 corresponding to the row address and column address. The activate and write commands are received by the command decoder 106, which provides internal commands so that the write data is received by data receivers in the IO circuit 122. Write clocks may also be provided to the external clock terminals for timing the receipt of the write data by the data receivers of the IO circuit 122. The write data is supplied via the IO circuit 122 to the read/write amplifiers 120, and by the read/write amplifiers 120 to the memory array 118 to be written into the memory cell MC.

Memory cells of the memory array 118 may require periodic refreshing to preserve data in the memory cells MC. A refresh signal AREF may be supplied to the refresh control circuit 116. The refresh control circuit 116 supplies a refresh row address RXADD to the row decoder 108, which may refresh one or more wordlines WL indicated by the refresh row address RXADD. The refresh control circuit 116 may control a timing of the refresh operation, and may generate and provide the refresh address RXADD. The refresh control circuit 116 may be controlled to change details of the refreshing address RXADD, or may operate based on internal logic.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 108, the internal potentials VOD and VARY are mainly used in the sense amplifiers 126 included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the IO circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the IO circuit 122 so that power supply noise generated by the IO circuit 122 does not propagate to the other circuit blocks.

In some embodiments, such as the one shown in FIG. 1, the device 100 may include an external DA pad 130. The external DA pad 130 may provide access to the device 100 for testing purposes. The external DA pad 130 may include one or more terminals for receiving signals from a testing device (not shown in FIG. 1) and/or providing signals to the testing device. For example, external DA pad 130 may include a terminal for receiving a clock signal (TEST_CK), command/address signals (TEST_CA), and/or test command signals (TEST_CMD). Although shown as a single pad in FIG. 1, in some embodiments, external DA pad 130 may include multiple pads. The external DA pad 130 may provide the signals to various components of the device 100. In some embodiments, the TEST_CK signal may be provided to clock input circuit 112 and/or command/address input circuit 102. In some embodiments, the TEST_CA signal may be provided to the command/address input circuit 102. In some embodiments, the TEST_CMD signal may be provided to a test decoder circuit 132. The test command signals TEST_CMD may include information regarding the tests performed by the testing device. For example, the TEST_CMD signal may include information that indicates a testing mode (e.g., loopback testing, 1DQ testing). Responsive to the TEST_CMD signal, the test decoder circuit 132 may provide various signals to one or more components of the device 100. For example, the test decoder circuit 132 may provide signals to enable or disable various internal test circuits, such as testing synchronization circuit 134 included in the command/address input circuit 102. In some embodiments, the test decoder circuit 132 may provide control signals responsive to TEST_CMD. The control signals may be used to select between different signals and/or signal paths in some embodiments.

According to embodiments of the present disclosure, the command/address input circuit 102 may include a testing synchronization circuit 134. The testing synchronization circuit 134 may receive command address signals TEST_CA from external DA pad 130 during testing of the device 100. In some embodiments, the testing synchronization circuit 134 may receive a clock signal TEST_CK from the external DA pad 130 during testing. However, in some embodiments, the tester input circuit may receive TEST_CK via the clock input circuit 112. As noted, the testing synchronization circuit 134 may receive one or more enable signals and/or control signals from test decoder circuit 132.

In some applications, the testing device may provide command address signals TEST_CA at SDR. In some embodiments, the testing synchronization circuit 134 provides signals that allow testing the DDR operations of the device 100. For example, the testing synchronization circuit 134 may allow the testing device to determine whether the command/address input circuit 102 properly latches commands at both the rising and falling edges of ICLK. In some embodiments, the testing synchronization circuit 134 may delay the TEST_CA signal such that commands of the TEST_CA signal are received at latches of the command/address input circuit 102 at both the rising and falling edges of clock signal ICLK.

Figure 2:
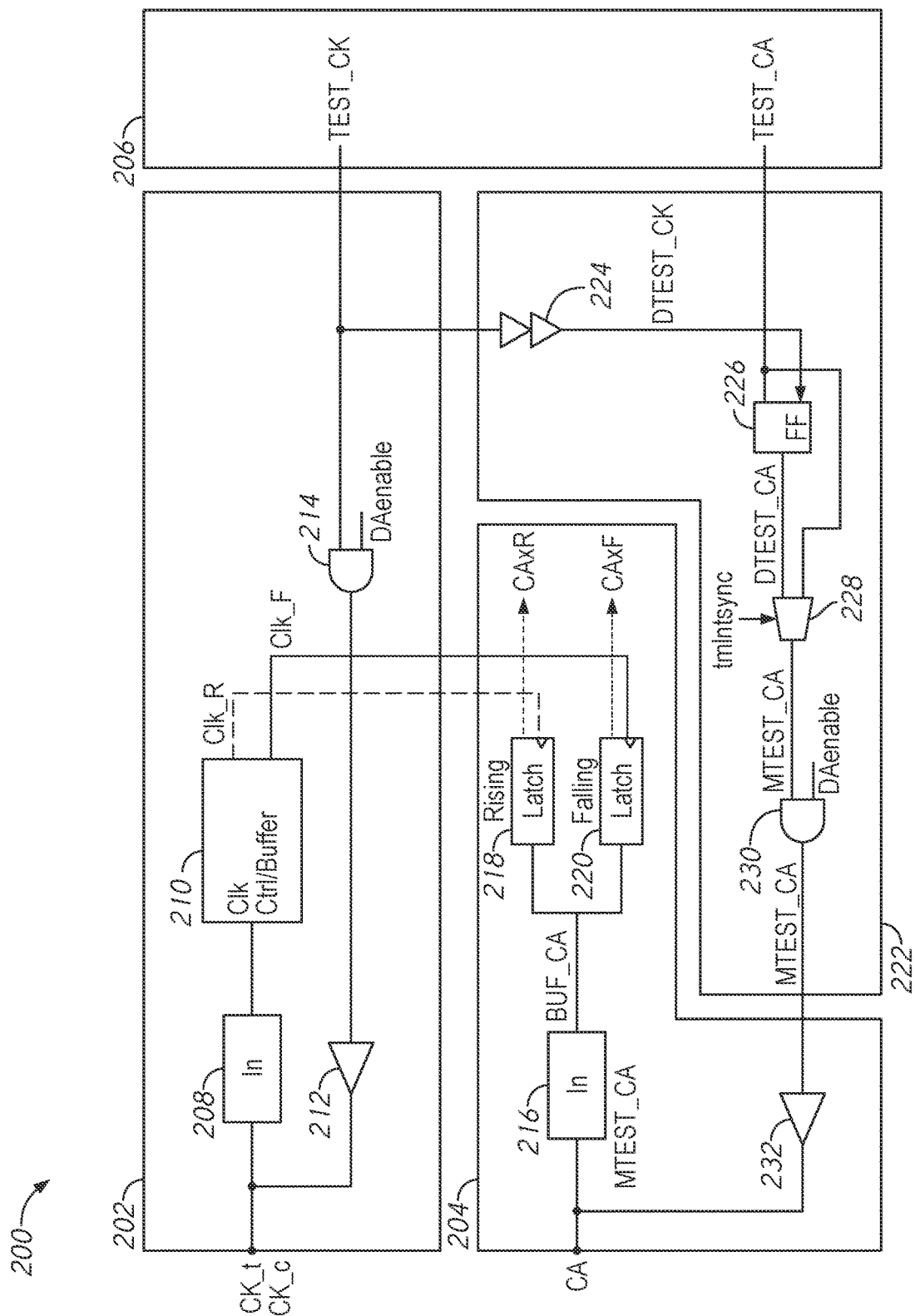
FIG. 2 is a block diagram of a portion of a semiconductor device according an embodiment of the disclosure.

FIG. 2 is a block diagram of a portion of a semiconductor device according an embodiment of the disclosure. In some embodiments, semiconductor device 200 may be a DDR device. In some embodiments, semiconductor device 200 may be included in semiconductor device 100 shown in FIG. 1. The device 200 may include a clock input circuit 202, a command/address input circuit 204, and an external DA pad 206. In some embodiments, clock input circuit 202 may be included in clock input circuit 112, command/address input circuit 204 may be included in command/address input circuit 102, and/or external DA pad 206 may be included in external DA pad 130. Although shown as a single pad in FIG. 2, in some embodiments, external DA pad 206 may include separate pads for different signals (e.g., different DA pads for TEST_CK and TEST_CA).

During normal operation of device 200 (e.g., when communicating with a memory controller), the clock input circuit 202 may receive complementary clock signals CK_t, CK_c at a terminal. The clock signals CK_t, CK_c may be provided to an input buffer 208, which may provide the clock signals to a clock controller/buffer 210. The clock controller/buffer 210 may generate internal clock signals Clk_R and Clk_F based, at least in part, on clock signals CK_t, CK_c. In some embodiments, Clk_R and Clk_F may be complementary clock signals.

During testing of device 200 (e.g., when communicating with a testing device), clock input circuit 202 may receive clock signal TEST_CK from external DA pad 206. In some embodiments, the TEST_CK signal may be received from and/or based on a signal received from a testing device (not shown) coupled to the external DA pad 206. In some embodiments, clock signal TEST_CK may include complementary clock signals. In some embodiments, TEST_CK may be provided to the input buffer 208 via a buffer 212. The TEST_CK signal may then be provided from the input buffer 208 to the clock controller/buffer 210 to generate internal clock signals Clk_R and Clk_F. In some embodiments, control logic 214 may be used to enable and disable the TEST_CK signal. In the example shown in FIG. 2, the control logic 214 includes an AND logic circuit. The control logic 214 may receive a test enable signal DAenable. In some embodiments, the DAenable signal may be provided by a test decoder circuit, such as test decoder circuit 132. In other embodiments, the DAenable signal may be provided from the testing device via the external DA pad 206. When the DAenable signal is active (e.g., logic high), the TEST_CK signal may be provided to the buffer 212. When the DAenable signal is inactive (e.g., logic low), the TEST_CK signal may not be provided (e.g., held at logic low). Although control logic 214 is shown as part of clock input circuit 202 in FIG. 2, in other embodiments, the control logic 214 may be located in another portion of device 200. For example, the control logic 214 may be located adjacent to external DA pad 206.

During normal operation of device 200, the command/address input circuit 204 may receive commands and/or addresses CA at a terminal. The commands and/or addresses may be provided to an input buffer 216. The input buffer 216 may provide buffered commands and/or addresses BUF_CA to latch 218 and latch 220. Latch 218 may receive clock signal Clk_R and latch 220 may receive complementary clock signal Clk_F from the clock input circuit 202. Both latch 218 and 220 may be configured to latch commands and/or addresses BUF_CA from the input buffer 216 on the rising edges of their respective clock signals. That is, latch 218 may latch a command and/or address BUF_CA provided by the input buffer 216 when Clk_R transitions from a low clock level to a high clock level and latch 220 may latch a command and/or address BUF_CA provided by the input buffer 216 when Clk_F transitions from a low clock level to a high clock level. Because clock signals Clk_R and Clk_F are complementary, with latches 218 and 220, the command/address input circuit 204 latches commands/addresses at times of both rising and falling edges of the clock signals. The command and/or address latched by latch 218 CAxR and the command and/or address latched by latch 220 CAxF may be provided to a command decoder circuit and/or an address decoder circuit, such as command decoder 106 and address decoder 104.

During testing of device 200, the command/address input circuit 204 may receive commands and/or addresses TEST_CA from the external DA pad 206. The TEST_CA signal may be received from the testing device coupled to the external DA pad 206. Command and/or address MTEST_CA signal based on the TEST_CA signal may be provided to input buffer 216, which may provide the commands and/or addresses of MTEST_CA to the latches 218 and 220 as BUF_CA. The MTEST_CA signal may be provided to the input buffer 216 from a buffer 232. The buffer 232 may receive the MTEST_CA signal from a testing synchronization circuit 222. Although the testing device may provide a clock signal TEST_CK at a frequency high enough to test the DDR specifications of device 200, the testing device may provide commands and/or addresses TEST_CA at SDR. The testing synchronization circuit 222 may permit approximation (e.g., simulation) of DDR operation based on the SDR TEST_CA signal.

The testing synchronization circuit 222 may receive the TEST_CA signal and latch the command and/or address of the TEST_CA signal with a flip-flop 226. The testing synchronization circuit 222 may receive the clock signal TEST_CK. The testing synchronization circuit 222 may delay the TEST_CK signal with a delay circuit 224 to provide a delayed TEST_CK signal DTEST_CK. In some embodiments, the delay circuit 224 may include a series of inverters and/or signal buffers. The DTEST_CK signal may be used to trigger the flip-flop 226. The triggering of the flip-flop 226 by the DTEST_CK signal may delay the propagation of TEST_CA to provide a delayed TEST_CA signal DTEST_CA as the MTEST_CA signal to the input buffer 216. As will be described in more detail with reference to FIG. 3, the delay circuit 224 may be selected such that commands and/or addresses TEST_CA are present at the latches 218 and 220 as the BUF_CA signal during the rising edges of the clock signals Clk_R and Clk_F.

Optionally, in some embodiments, such as the one shown in FIG. 2, the testing synchronization circuit 222 may include a multiplexer 228. The multiplexer 228 may receive the DTEST_CA signal from the flip-flop 226 and the current TEST_CA signal from the external DA pad 206. The multiplexer 228 provides the DTEST_CA signal or the current TEST_CA signal as a MTEST_CA signal. Whether the DTEST_CA signal or the current TEST_CA signal is provided from the multiplexer 228 as the MTEST_CA signal may be controlled by control signal tmIntsync. In some embodiments, tmIntsync may be provided by the test decoder circuit. In other embodiments, the tmIntsync may be provided from the testing device via the external DA pad 206. In some applications, the delay of the commands and/or addresses to simulate DDR operation may only be desired in certain testing modes. Thus, for some testing modes, tmIntsync may be provided with a logic state that causes the multiplexer 228 to provide the current TEST_CA signal as the MTEST_CA signal and in other testing modes, tmIntsync may be provided with another logic state that causes multiplexer 228 to provide the DTEST_CA signal from the flip-flop 226 as the MTEST_CA signal.

In some embodiments, control logic 230 may be used to enable and disable the MTEST_CA signal provided by the testing synchronization circuit 222. In the example shown in FIG. 2, the control logic 230 includes an AND logic circuit. The control logic 230 may receive the test enable signal DAenable. When the DAenable signal is active, the MTEST_CA signal may be provided to the buffer 232. When the DAenable signal is inactive, the MTEST_CA signal may not be provided.

Although shown as separate from the command/address input circuit 204, in some embodiments, the testing synchronization circuit 222 may be included with command/address input circuit 204 as shown in the example in FIG. 1.

In the embodiment shown in FIG. 2, the command/address input circuit 204 includes latches 218 and 220 that are both configured to latch commands and/or addresses on the rising edges of clock signals Clk_R and Clk_F, respectively. However, in other embodiments, one of the latches 218 or 220 may latch commands on the rising edge of a clock signal while the other one of the latches 218 or 220 latches commands on the falling edge of the clock signal. In these embodiments, only one clock signal (e.g., CK, TEST_CK) may be provided to both latches 218 and 220 rather than two complementary clock signals.

Figure 3:
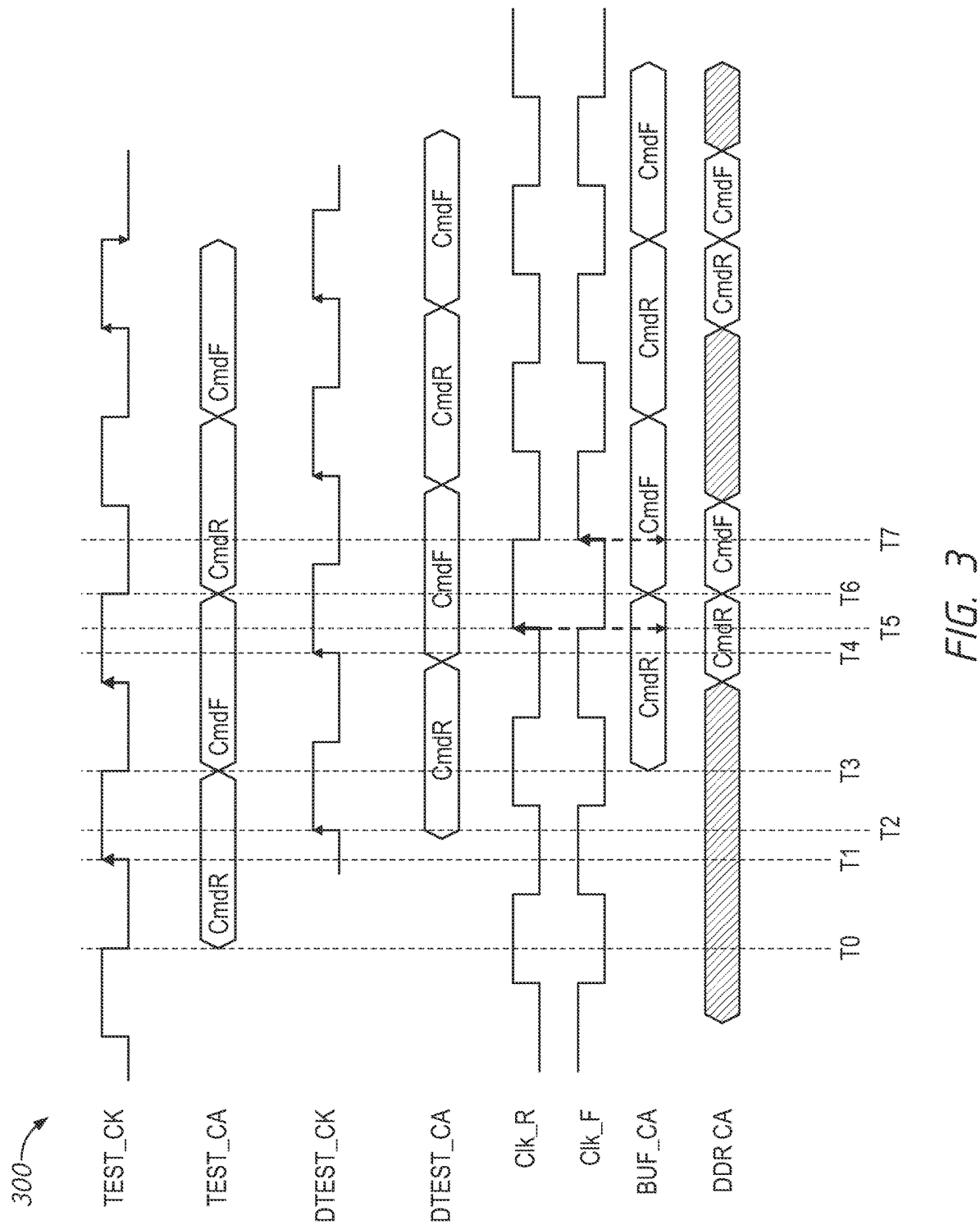
FIG. 3 is a timing diagram of signals of a semiconductor device according to an embodiment of the disclosure.

FIG. 3 is a timing diagram of signals of a semiconductor device according to an embodiment of the disclosure. The states of signals of device 100 and/or device 200 may be reflected in timing diagram 300 and the signals of timing diagram 300 will be described with reference to FIGS. 1 and 2. However, the timing diagram 300 may reflect the operation of memory devices according to embodiments of the present disclosure other than the specific memory device shown in FIGS. 1 and 2.

The first line of the timing diagram 300 is a clock signal TEST_CK provided to the device 100 and/or device 200 by a testing device. The TEST_CK signal may be provided to clock input circuit 112 and/or 202. The timing of clock signal TEST_CK shown on the first line may be the timing when TEST_CK is provided at the external DA pad 130 and/or external DA pad 206. The second line of timing diagram 300 is a command/address signal TEST_CA provided to the device 100 and/or device 200 by the testing device. The command/address signal TEST_CA may include commands and/or addresses. In the example shown in FIG. 3, the command/address signal TEST_CA includes commands/addresses CmdR and CmdF. In some embodiments, CmdR and CmdF may include separate commands and/or addresses. The separate commands and/or addresses may be different or the same (e.g., repeated command and/or address). In some embodiments, CmdR and CmdF may include portions of a command and/or address. For example, CmdR may include a command and CmdF may include an address associated with the command. However, other combinations of portions of a command and/or address provided in CmdR and CmdF may be used in other examples. The TEST_CA signal may be provided to command/address input circuit 102 and/or 204. The timing of TEST_CA signal shown on the second line may be the timing when TEST_CA is provided at the external DA pad 130 and/or 206.

The third line of timing diagram 300 is a clock signal DTEST_CK. The DTEST_CK signal may be the delayed TEST_CK signal provided from the delay circuit 224, for example, of testing synchronization circuit 134 and/or 222. The fourth line of timing diagram 300 is a command/address signal DTEST_CA. The DTEST_CA signal may be the TEST_CA signal from the external DA pad 130 and/or 206 and provided at the output of flip-flop 226 which may be included in testing synchronization circuit 134 and/or 222.

The fifth and sixth lines of timing diagram 300 are complementary clock signals Clk_R and Clk_F at latch 218 and latch 220, respectively provided by the clock controller/buffer circuit 210, which may be included in clock input circuit 112 and/or 202. The seventh line of timing diagram 300 is a command/address signal BUF_CA (DTEST_CA) provided as the BUF_CA signal to the latches 218 and 220. The BUF_CA (DTEST_CA) signal may be the TEST_CA signal. The final line of timing diagram 300 is an exemplary DDR command/address signal DDR CA.

At or about time T0, command and/or address CmdR may be provided as Test_CA along with clock signal TEST_CK from external DA pad 130 and/or 206. The TEST_CK signal may be provided to delay circuit 224, which delays TEST_CK and provides DTEST_CK. The clock signal TEST_CK may have a rising edge (e.g., transition from a low clock level to a high clock level) at or around time T1 while DTEST_CK does not have a rising edge until at our around time T2. In some embodiments, DTEST_CK may be delayed relative to TEST_CK by approximately ¼ of a clock cycle (e.g., delayed by 10-30% of a clock cycle). The rising edge of the DTEST_CK may be used to trigger the flip-flop 226 to latch CmdR at or around time T2. Due to the DTEST_CK, the TEST_CA signal including CmdR provided by the flip-flop 226 as DTEST_CA is delayed relative to TEST_CA provided by the external DA pad 130 and/or 206. At or around time T3, a command and/or address CmdF may be provided as TEST_CA from external DA pad 206. CmdF may be latched by the flip-flop 226 at or around time T4 responsive to another rising edge of clock signal DTEST_CA. Once latched, the flip-flop 226 may provide CmdF as DTEST_CA.

As disclosed herein, complementary clock signals Clk_R and Clk_F may be generated based, at least in part, on TEST_CK. However, as shown in timing diagram 300, Clk_R and Clk_F may be delayed relative to TEST_CK. The delay may be due to various propagation delays of one or more components of the device 100 and/or 200. For example, control logic 214, buffer 212, input buffer 208, and/or clock controller/buffer circuit 210 may contribute delays to TEST_CK which may result in an overall delay to Clk_R and Clk_F relative to TEST_CK.

The DTEST_CA signal (e.g., delayed TEST_CA signal) may be provided from the flip-flop 226 to the latches 218 and 220 as BUF_CA (DTEST_CA). However, as shown in timing diagram 300, similar to Clk_R and Clk_F, DTEST_CA may be further delayed by one or more components of device 200. For example, multiplexer 228, control logic 230, buffer 232, and/or input buffer 216 may contribute propagation delays to the DTEST_CA signal. Thus, CmdR as provided by the BUF_CA (DTEST_CA) signal may be delayed relative to CmdR as provided by the DTEST_CA at FF signal. The overall delays of TEST_CA from the external DA pad 206 to the latches 218 and 220 may be such that two consecutive commands/addresses CmdR and CmdF are provided at the latches 218 and 220 during the rising edges of Clk_R and Clk_F, respectively. From another perspective, the overall delays of TEST_CA may be such that a transition between two consecutive commands/addresses CmdR and CmdF of the command/address signal BUF_CA occurs at a time between the rising edge of Clk_R and the rising edge of Clk_F.

As shown in timing diagram 300, Clk_R has a rising edge at or around time T5 while CmdR is provided as BUF_CA (DTEST_CA). Responsive to the rising edge of Clk_R, latch 218 may latch CmdR. At or around time T6, BUF_CA (DTEST_CA) transitions from CmdR to CmdF, responsive to the flip-flop 226 latching CmdF at or around time T4 as previously described. At or around time T7, Clk_F has a rising edge. Responsive to the rising edge of Clk_F, latch 220 may latch CmdF. Thus, command/address signals provided by TEST_CA (provided as the BUF_CA (DTEST_CA) signal) are latched on the rising edges of both Clk_R and Clk_F. The latched commands/addresses CmdR and CmdF may then be provided by latches 218 and 220 as the commands and/or addresses CAxR and CAxF, all respectively.

DDR CA illustrates the "simulated" or approximated DDR timing of command/address signals of device 100 and/or 200 based, in part, on the delays of TEST_CA provided by the testing synchronization circuit 134 and/or 222. As disclosed herein, devices 100 and/or 200 may be DDR DRAM memory devices. That is, the devices may be capable of receiving and latching command/address signals provided at both rising and falling edges of a clock signal (e.g., ICLK in FIG. 1). In typical DDR operation, command/address signals are provided for half a clock cycle, and in typical SDR operation, command/address signals are provided for an entire clock cycle. While the testing synchronization circuit 134 and/or 222 may not reduce a time period over which a commands/addresses CmdR and CmdF are provided, by changing the timing of (e.g., delaying) the commands/addresses CmdR and CmdF such that the transition between CmdR and CmdF occurs between the rising edges of Clk_R and Clk_F, the device 100 and/or 200 latches the command/address signals as if CmdR and CmdF had been provided at DDR. As shown by the large shaded regions in DDR CA, the command throughput of DDR is not simulated or approximated from the SDR TEST_CA signal. However, the ability to test latching of commands in DDR operation at a lower throughput may be sufficient to confirm proper operation of device 100 and/or 200.

Figure 4:
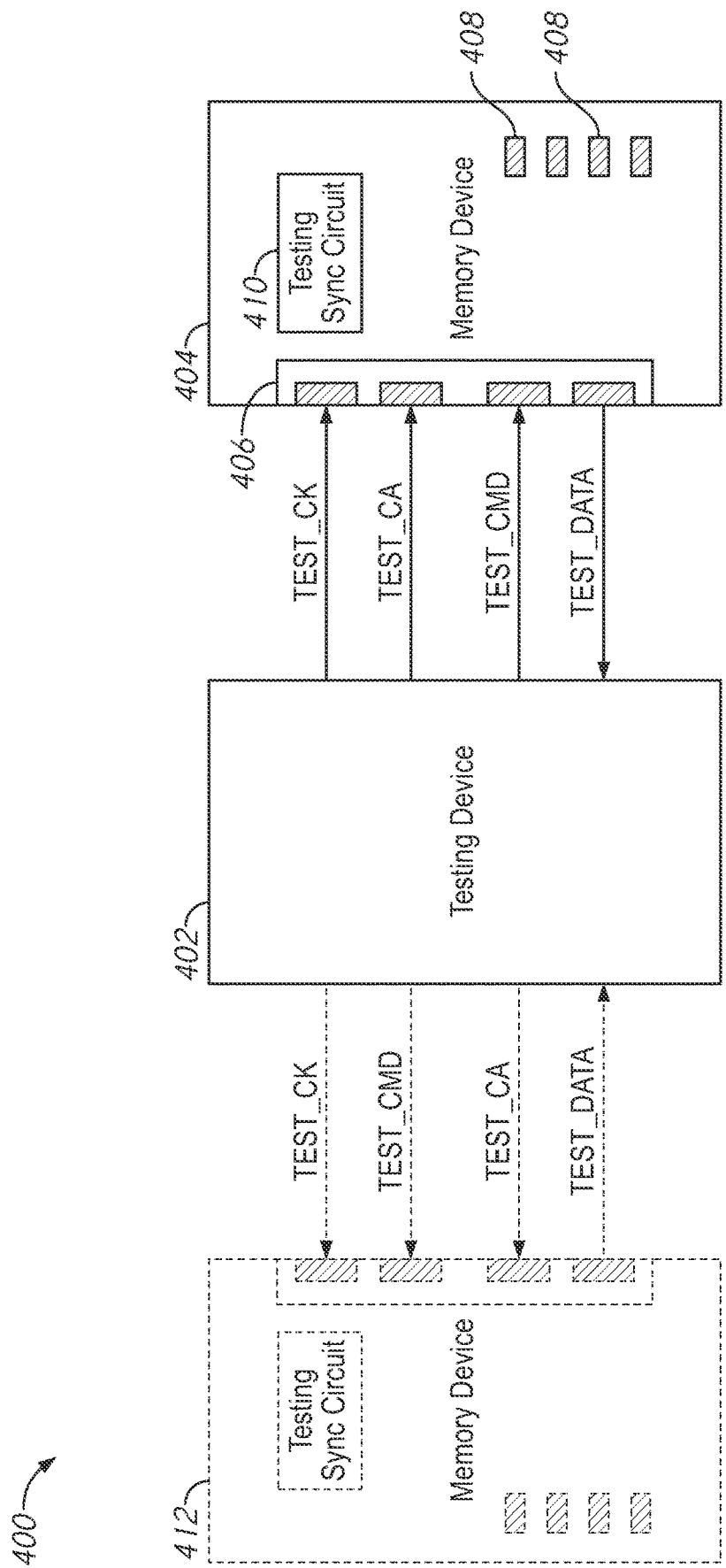
FIG. 4 is a block diagram of a testing system according to an embodiment of the disclosure.

FIG. 4 is a block diagram of a testing system according to an embodiment of the disclosure. The testing system 400 may include a testing device 402 and a memory device 404. In some embodiments, the memory device 404 may include device 100 and/or device 200. In some embodiments, the testing device 402 may provide signals to and receive signals from the memory device 404 via an external DA pad 406. In some embodiments, the external DA pad 406 may be at a location on the memory device 404 different than pads 408 that may be coupled to an external device (e.g., a memory controller). Pads 408 may include DQ pads, a CK/CK terminals, and/or CA terminals.

As shown in FIG. 4, in some embodiments, the testing device 402 may provide a test clock signal TEST_CK and/or test command/address signal TEST_CA to the memory device 404 via the external DA pad 406. The test clock signals and test command/address signals may be provided to a clock input circuit (e.g., clock input circuit 112) and a command/address input circuit (e.g., command/address input circuit 102) of memory device 404, respectively. In some embodiments, the TEST_CK signal may be provided at DDR (e.g., 2 GB/s) whereas the TEST_CA signal is provided at SDR (e.g., 1 GB/s). The TEST_CK signal may be used to generate internal timing signals for the memory device 404 during testing. The TEST_CA signal may be used to provide commands and/or addresses for memory operations during testing. The testing device 402 may provide test command signals TEST_CMD to the external DA pad 406. The TEST_CMD signal may be provided to a test command decoder circuit (e.g., test command decoder circuit 132) in some embodiments. The test command signals TEST_CMD may include information regarding the tests performed by the testing device 402. For example, the TEST_CMD signal may include information that indicates a testing mode (e.g., loopback testing, 1DQ testing).

For certain testing modes, as indicated by the TEST_CMD signal, a testing synchronization circuit 410 of memory device 404 may be used to delay the Test_CA signal provided to latches of the command/address input circuit. In some embodiments, the delay provided by the testing synchronization circuit 410 may be such that the command/address signals provided by the TEST_CA signal transition between the rising and falling edges of a clock signal provided to the latches. In some embodiments, the delay provided by the testing synchronization circuit 410 may be selected such that the command/address signals provided by the TEST_CA signal transition between the rising edges of two complementary clock signals provided to the latches. In this manner, the SDR commands provided by TEST_CA may be latched in accordance with DDR operation. This may allow the testing device 402 to test some or all DDR functionality of the memory device 404.

In some embodiments, the memory device 404 may provide data TEST_DATA to the testing device 402. The TEST_DATA may be provided responsive, at least in part, to the command/address signals TEST_CA. The testing device 402 may analyze the received TEST_DATA to determine whether the memory device 404 is operating properly. If the memory device 404 is determined to be operating properly, the memory device 404 may be packaged with an external device in some embodiments. If the memory device 404 is determined to be defective (e.g., not operating properly), the memory device 404 may be discarded or repaired and tested again.

Optionally, in some embodiments, testing device 402 may test multiple memory devices in parallel (e.g., at the same time). For example, testing device may test memory device 412 while also testing memory device 404. In some embodiments, memory device 412 may include substantially the same components as memory device 404. Although only two memory devices are shown coupled to testing device 402, any number of memory devices (e.g., 4, 8, 16) may be coupled to testing device 402.

Figure 5:
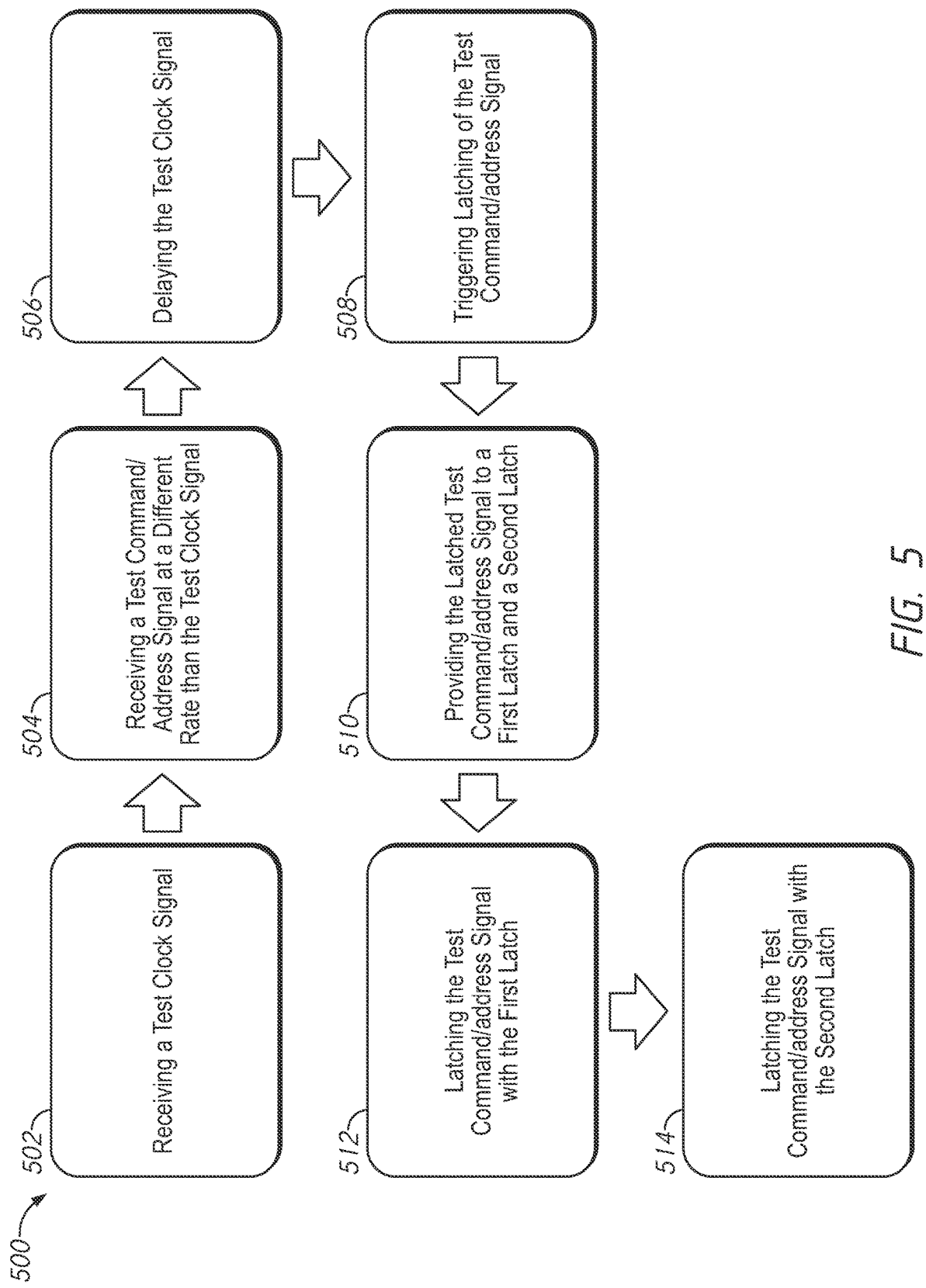
FIG. 5 is a flow chart of a method according to an embodiment of the disclosure.

FIG. 5 is a flow chart of a method according to an embodiment of the disclosure. The method 500 may be performed, at least in part, by devices 100, 200, 404, and/or 412 in some embodiments.

At block 502, "receiving a test clock signal" may be performed. The test clock signal may be received at a rate (e.g., DDR, 2 GB/s) in some embodiments. The test clock signal may be received by a clock input circuit (e.g., clock input circuit 112 and/or 202) in some embodiments. The test clock signal may be received by a testing synchronization circuit (e.g., testing synchronization circuit 134, 222, and/or 410) in some embodiments. At block 504, "receiving a test command/address signal at a different rate than the test clock signal" may be performed. In some embodiments, the test command/address signal may be received at a rate slower than the rate of the test clock signal is received at. In some embodiments, the test command/address signal may be received by the testing synchronization circuit.

At block 506 "delaying the test clock signal" may be performed. In some embodiments, block 506 may be performed by the testing synchronization circuit. In some embodiments, the delaying may be provided by a delay circuit, such as delay circuit 224. At block 508 "triggering latching of the test command/address signal" may be performed. In some examples, the trigging and latching may be performed by the testing synchronization circuit. In some embodiments, the trigging may be based the delayed test clock signal. In some embodiments, the latching may be performed by a flip-flop, such as flip-flop 226.

At block 510 "providing the latched test command/address signal to a first latch and a second latch" may be performed. In some embodiments, the latched test command/address signal may be provided by the testing synchronization circuit. At block 512, "latching the test command/address signal with the first latch" may be performed. In some embodiments, the latching may be performed by the first latch responsive to a first edge of a second clock signal. At block 514, "latching the test command/address signal with the second latch" may be performed. In some embodiments, the latching may be performed by the second latch responsive to a second edge of the second clock signal. In some embodiments, the second clock signal may be generated, based at least in part, on the test clock signal. For example, the second clock signal may be generated by clock input circuit 112 and/or clock input circuit 202 in some embodiments. In some embodiments, the first latch may latch at least one of a first command or address provided by the test command/address signal and the second latch may latch at least one of a second command or address provided by the test command/address signal.

In some embodiments, prior to block 502, enabling the test clock signal and the test command/address signal may be performed. The enabling may be performed by control logic, such as control logic 214 and 230 in some embodiments. The enabling may be responsive to an enable signal provided by a test decoder circuit, such as test decoder circuit 134, in some embodiments.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present apparatuses, systems, and methods and should not be construed as limiting the appended claims to any particular embodiment or group of embodiments. Thus, while the present apparatuses, systems, and methods have been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a first latch configured to latch a command/address signal on a first edge of a clock signal, wherein the command/address signal includes a first portion and a second portion;
   a second latch configured to latch the command/address signal on a second edge of the clock signal, wherein the first edge and the second edge are included a same clock cycle of the clock signal; and
   a testing synchronization circuit configured to provide a delay to the command/address signal provided to the first latch and the second latch, wherein the delay causes a transition of the command/address signal from the first portion to the second portion to occur at a time after the first edge of the clock signal and before the second edge of the clock signal, wherein the first latch latches the command/address signal before the transition and the second latch latches the command/address signal after the transition.

2. The apparatus of claim 1, wherein the testing synchronization circuit comprises a flip-flop configured to latch the command/address signal.

3. The apparatus of claim 2, wherein the testing synchronization circuit further comprises a delay circuit configured to receive a second clock signal and provide the second clock signal with a second delay to the flip-flop, wherein the second clock signal with the second delay is used to trigger the flip-flop.

4. The apparatus of claim 3, wherein the delay circuit comprises a plurality of series inverters.

5. The apparatus of claim 2, wherein the testing synchronization circuit further comprises a multiplexer configured to provide the command/address signal with the delay or the command/address signal without the delay responsive to a control signal.

6. The apparatus of claim 5, further comprising a test decoder circuit, wherein the test decoder circuit is configured to provide the control signal to the multiplexer.

7. The apparatus of claim 2, wherein the testing synchronization circuit further comprises a control logic circuit configured to enable the command/address signal responsive to an enable signal.

8. The apparatus of claim 7, further comprising a test decoder circuit, wherein the test decoder circuit is configured to provide the enable signal to the control logic circuit.

9. The apparatus of claim 1, further comprising a clock controller/buffer circuit configured to generate a second clock signal and a third clock signal complementary to the second clock signal based on the clock signal and provide the second clock signal to the first latch and the third clock signal to the second latch, wherein the first edge of the clock signal is a rising edge and corresponds to a rising edge of the second clock signal and the second edge of the clock signal is a falling edge and corresponds to a rising edge of the third clock signal.

10. The apparatus of claim 1, further comprising an external pad, wherein the command/address signal and the clock signal are provided from a testing device via the external pad.

11. A system comprising:
    a testing device configured to provide a command/address signal and a clock signal;
    a memory device coupled to the testing device, the memory device comprising:
      a clock input circuit configured to receive the clock signal and generate an internal clock signal based, at least in part, on the clock signal;
      a testing synchronization circuit configured to receive the command/address signal and the clock signal and generate a delayed command/address signal based on the command/address signal;
      a command/address input circuit comprising a first latch and a second latch configured to receive the internal clock signal and the delayed command/address signal, wherein the first latch is configured to latch the delayed command/address signal at a first edge of the internal clock signal and the second latch is configured to latch the delayed command/address signal at a second edge of the internal clock signal, wherein the delayed command/address signal includes a first command/address at the first edge and the delayed command/address signal includes a second command/address at the second edge.

12. The system of claim 11, wherein the internal clock signal comprises a first clock signal and a second clock signal complementary to the first clock signal, wherein the first latch receives the first clock signal and the second latch receives the second clock signal, wherein the first edge is a rising edge of the first clock signal and the second edge is a rising edge of the second clock signal.

13. The system of claim 11, further comprising a second memory device coupled to the testing device, wherein the testing device is configured to provide the command/address signal and the clock signal to the memory device and the second memory device in parallel.

14. The system of claim 11, wherein the memory device is configured to provide data to the testing device, and the testing device is further configured to analyze the data to determine whether the memory device is operating properly.

15. The system of claim 11, wherein the clock signal is a double data rate signal and the command/address signal is a single data rate signal.

16. A method comprising:
    receiving a test clock signal at a first rate;
    receiving a test command/address signal at a second rate slower than the first rate;
    delaying the test clock signal with a testing synchronization circuit;

triggering, with the delayed test clock signal, latching of the test command/address signal by the testing synchronization circuit;

providing, with the testing synchronization circuit, the latched test command/address signal to a first latch and a second latch;

latching, with the first latch, the test command/address signal, responsive to a first edge of a second clock signal; and latching, with the second latch, the test command/address signal, responsive to a second edge of the second clock signal.

17. The method of claim 16, wherein the first latch latches at least one of a first command or address provided by the test command/address signal and the second latch latches at least one of a second command or address provided by the test command/address signal.

18. The method of claim 16, further comprising enabling the test clock signal and the test command/address signal responsive to an enable signal provided by a test decoder circuit.

19. The method of claim 16, further comprising generating the second clock signal based, at least in part, on the test clock signal.

20. The method of claim 16, wherein the testing synchronization circuit latches the test command/address signal with a flip-flop.

* * * * *